United States Patent [19]

Asprey

[11] Patent Number: 5,576,723
[45] Date of Patent: *Nov. 19, 1996

[54] VGA SIGNAL CONVERTER FOR CONVERTING VGA COLOR SIGNALS TO VGA MONOCHROME SIGNALS

[75] Inventor: Robert R. Asprey, Harvest, Ala.

[73] Assignee: Cybex Computer Products Corporation, Huntsville, Ala.

[*] Notice: The term of this patent shall not extend beyond the expiration date of Pat. No. 5,299,306.

[21] Appl. No.: 219,979

[22] Filed: Mar. 29, 1994

Related U.S. Application Data

[63] Continuation-in-part of Ser. No. 597,544, Oct. 12, 1990, Pat. No. 5,299,306, which is a continuation-in-part of Ser. No. 488,710, Mar. 5, 1990, Pat. No. 5,268,676, which is a continuation-in-part of Ser. No. 447,010, Dec. 5, 1989, Pat. No. 5,193,200, which is a continuation-in-part of Ser. No. 95,140, Sep. 11, 1987, Pat. No. 4,885,718.

[51] Int. Cl.⁶ ................................................... G09G 5/00
[52] U.S. Cl. ......................................... 345/2; 345/153
[58] Field of Search ................................ 345/147, 77, 63, 345/20, 3, 132, 150, 153, 1, 2; 395/153; 348/659, 793

[56] References Cited

U.S. PATENT DOCUMENTS

| | | | |
|---|---|---|---|
| 3,715,470 | 2/1973 | Craig | 348/659 |
| 4,727,414 | 2/1988 | Ranf | 348/793 |
| 4,739,312 | 4/1988 | Oudshoorn | 345/147 |
| 4,929,933 | 5/1990 | McBeath | 345/150 |
| 5,091,718 | 2/1992 | Beatty | 345/22 |
| 5,130,702 | 7/1992 | Lee | 345/153 |
| 5,227,768 | 7/1993 | Beckett et al. | 345/153 |
| 5,245,327 | 9/1993 | Pleva | 345/147 |
| 5,268,676 | 12/1993 | Asprey | 345/2 |
| 5,299,306 | 3/1994 | Asprey | 395/153 |

*Primary Examiner*—Steven Saras
*Attorney, Agent, or Firm*—C. A. Phillips

[57] ABSTRACT

A converter for converting VGA color signals to gray scale monochrome signals wherein each of the color signals, red, green, and blue, are processed through a circuit consisting of an emitter-follower, a selected value resistor, and a diode and wherein the outputs of the three circuits are connected together and across a load impedance for an analog monochrome monitor.

28 Claims, 2 Drawing Sheets

VGA SIGNAL CONVERTER FOR CONVERTING VGA COLOR SIGNALS TO VGA MONOCHROME SIGNALS

CROSS REFERENCE OF RELATED APPLICATION

This application is a continuation-in-part of application Ser. No. 07/597,544, filed on Oct. 12, 1990, now U.S. Pat. No. 5,299,306, which is a continuation-in-part of application Ser. No. 07/488,710, filed on Mar. 5, 1990, now U.S. Pat. No. 5,268,676 which is a continuation-in-part of application Ser. No. 07/447,010, filed on Dec. 5, 1989, now U.S. Pat. No. 5,193,200 which is a continuation-in-part of application Ser. No. 07/095,140, filed on Sep. 11, 1987, now U.S. Pat. No. 4,885,718.

FIELD OF THE INVENTION

This invention relates to a method for mixing analog VGA red, green, and blue computer video signals to produce a gray scale VGA analog monochrome video signal wherein each of the red, green, and blue VGA video signals and mixtures thereof are represented by an optimally contrasting shade of gray.

BACKGROUND OF THE INVENTION

It is a convenient practice to physically separate a digital computer from the monitor and keyboard by which the computer is monitored and controlled. The monitor and keyboard may be in the form of a single housed unit, such as a terminal, or the keyboard and monitor may be separate components coupled to the computer by cables.

Also as a matter of convenience, there are separate electrical connectors on these computers for receiving mating monitor and keyboard plugs, one plug being connected to a monitor cable from a monitor, and the other plug being connected to a keyboard cable from a keyboard. Normally, these cables are on the order of four to eight feet in length, enabling some, but limited, separation of a monitor and keyboard from a computer. This typically requires that the computer, monitor, and keyboard be generally located together.

It is to be appreciated that there are situations, in fact, many, where it is desirable to separate the computer from the monitor and keyboard. This may be by virtue of space limitations or because of environmental considerations, the latter sometimes including an inhospitable environment for the delicate mechanisms, such as disk drives, that are incorporated in most computers. Here, there are extended range computer communications links that allow various degrees of separation between the computer and monitor and keyboard, as set forth in U.S. Pat. No. 5,257,390, issued to Asprey, and which is incorporated herein by reference. Additionally, situations occur wherein it may be desirable to locate a computer coupled to a color monitor in a control room and to locate an inexpensive IBM standard monochrome monitor, also coupled to the computer by one of the aforementioned extended links, in a factory or manufacturing environment, or other inhospitable environment, a distance away from the computer.

These inexpensive, IBM standard monitors are driven by an analog monochrome video signal applied to the G, or green, video signal output terminal of a 15-terminal subminiature high density "D" connector mounted on the computer, also as specified by IBM VGA standards. Particularly, in PC-type computers outputting VGA color video signals, the color signals are provided from the computer as discrete R (red), G (green), and B (blue) video signals. These color signals are provided on terminals occupying specified positions in the 15-terminal connector, the terminals being designated R, G, and B and the connector couplable also to a color VGA monitor. As stated, in the monochrome mode, a single video signal is applied to the terminal occupying the G position, which is coupled as an input to the monochrome monitor. In the instance of a monochrome monitor being coupled to the computer, the monochrome video signal drives the monitor image at only four levels of brightness or intensity, these levels being OFF, DIM, NORMAL, and BRIGHT, with the most intense level, BRIGHT, being developed by a signal of about 700 millivolts. The NORMAL and DIM levels of intensity are developed by progressively smaller amplitudes of the monochrome video signal.

Where software for a color monitor provides color backgrounds for highlighting and a different color of data on the highlighted backgrounds, problems arise when the signal for a color monitor is split and one of the color signals fed to the monochrome monitor or the color signal itself is applied to a monochrome monitor. Here, since the color signals are provided on R, G, and B terminals, and the monochrome monitor is only provided with a G terminal input for both the background and data, any red and blue data on the R and B terminals is not displayable on the monitor. Further, where there are mixtures of colors containing a green component in the color background, such as yellow or cyan, and data containing a green component of equal intensity as the green component of the background is superimposed on the background, the green component in the background colors masks the green component of the data. For example, yellow characters on a cyan background, when applied to a monochrome IBM standard monitor, produces an all-white display, with the characters being indistinguishable from the background.

This particular problem has been in existence for several years, with attempts to overcome the problem being software oriented. These solutions utilize various symbols to denote colors in a monochrome environment and do not represent color data in a manner that is pleasing to the eye or readily discernible as a contrast, such as the aforementioned colored background and differently colored letters.

One patent of which applicant is aware is U.S. Pat. No. 4,641,262 issued to Bryan. In this patent, TTL level CGA red, green, blue, and intensity signals are converted to a maximum of 16 shades of gray. Further, the Bryan system may be properly labelled one wherein the color signals are algebraically proportionally summed, meaning that where more than one color signal is present, a higher signal adds to the resultant signal value, and a lower signal subtracts from the resultant signal value. In it, the TTL levels, generally designated as either high or low, range in value, with high signals being on the order of 3 to 5 volts and low signals being on the order of 0 to 2 volts. The effect of binary weighting multiplies each signal by 1, 2, 4, or 8. Perhaps the most significant effect that can arise with this system is that where there is a high value color signal, thus indicating a significant brightness for that signal, and there is a lesser value or 0 from another, the result will be that the overall brightness is inordinately reduced. This results from the straight proportional summing of signal values at a summing junction.

In any event, the applicant finds that such an algebraic combination of signals, or summing, does not provide for an ideal combination of color signals for a monochrome presentation.

Also, there is no provision in Bryan to operate more than one monitor simultaneously or to easily configure the hardware to provide both color or monochrome signals to, for example, two monitors or to locate either of the monitors at a remote distance from the computer.

Accordingly, it is an object of this invention to provide simple, reliable circuitry that receives analog VGA color video signals from a computer and converts, but does not algebraically add, these signals to monochrome signals for an IBM standard analog VGA monochrome monitor wherein the conversion results in an improved gray scale.

SUMMARY OF THE INVENTION

A conversion system is particularly disclosed for converting color analog VGA video signals typically varying continuously from 0 voltage to about 700 millivolts to an analog monochrome gray scale video signal. The color video signals R, G, and B are obtained from a video source, with the R, G, and B signals being applied to separate R, G, and B signal conductors. Each of the signals from the conductors is applied through a buffering device and a discrete impedance to a common junction connected to a load impedance. The required effect of the buffering device is that it enable only unidirectional signal flow, from input to output, and thus the current flow cannot be backwards to draw off signal value. Thus, a signal, or combination of signals, may contribute to a monochrome signal, but not subtract from it. In other words, the present system will only accept a signal fed to the summing point which is added to the voltage otherwise there. This is in distinct contrast to the system of Bryan, which will enable bilateral flow and thus enable a low level or zero signal to subtract from the results.

DETAILED DESCRIPTION OF THE DRAWINGS

Figure 1:
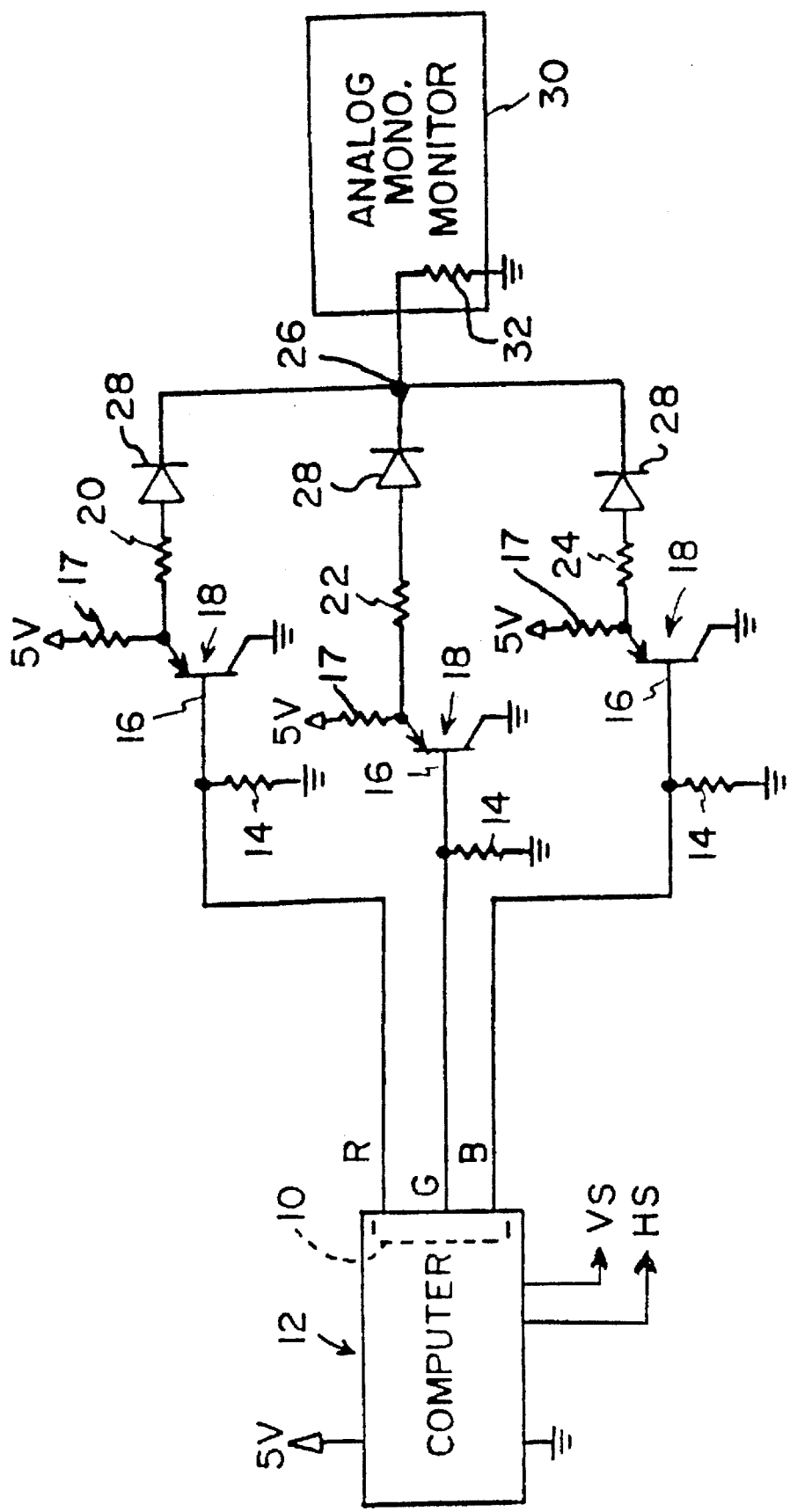
FIG. 1 is a schematic diagram of circuitry for eliciting color signals from a computer and for converting the color signals to monochrome gray scale wherein contrast between the shades of gray is optimized.

Referring initially to FIG. 1, circuitry is shown for translating analog VGA color signals R, G, and B to a monochrome VGA video signal and providing the monochrome signal to a monochrome monitor. The VGA color signals R (red), G (green), and B (blue), each having a signal swing ranging from about 0 to 700 millivolts, originate from a VGA video source, such as video card 10 located in an IBM PC-type computer 12. These video signals are typically provided from video terminals in a 15-terminal high density subminiature "D" connector coupled to card 10, with each of the R, G, and B signals being applied across a 75-ohm load resistor 14. Resistor 14 emulates the load of each of the R, G, and B circuits of a typical VGA color monitor. As such, analog R, G, and B video signals of from about 0 to 700 millivolts, each are developed across resistors 14. These analog video signals are applied to corresponding bases 16 of PNP transistors 18, which each have an emitter coupled via a load resistor 17 to a source of power, such as +5 volts, and a collector coupled to a reference ground potential, the source of power being from computer 12. As connected, transistors 18 are coupled in emitter-follower configuration, meaning that the voltage on the emitters of transistors 18 will track the voltage applied to the bases thereof, the transistors also developing a positive offset of about 700 millivolts on the emitters due to the voltage drop across the transistors. Thus, while there is current amplification, the voltage at the emitter will vary from approximately 0.7 volt to 1.4 volts with an input voltage swing of from 0 to 0.7 volt. Each of resistors 20, 22, and 24 is coupled at one end to an emitter of one of transistors 18 and in series with a diode 28 to a common, summing point 26 and across summing resistor 32. Significantly, each diode 28 functions as a buffer to prevent current back flow, that is, current flow from summing resistor 32 back to the emitter of a transistor 18. Also, each diode 28 provides a 700-millivolt voltage drop which cancels a positive offset effected by a respective transistor 18. Thus, the voltage applicable to summing resistor 32 will be in the range of 0 to 700 millivolts, less the voltage drop across one of resistors 20, 22, or 24, which serve as current limiters. These resistors, which will be discussed further below, typically are of selected values to achieve a selected variation in gray scale for the monochrome video signal, as will be discussed.

Significantly, for providing an example of optimum contrast between various shades of gray obtained from the R, G, and B video signals, it has been found that discrete values for resistors 20, 22, and 24 may be within about a 20 percent range of about 20 ohms, 7.5 ohms, and 27 ohms, respectively. These particular resistances drop the potentials of the R, G, and B video signals from a maximum of 700 millivolts, which corresponds to the brightest possible intensity displayable by an analog monitor, to a maximum of about 546 millivolts for a full-scale red video signal, 637 millivolts for a full-scale green video signal, and 511 millivolts for a full-scale blue video signal. As such, the red video signal current is limited by 22 percent, the green video signal current is limited by 9 percent, and the blue video signal current is limited by 27 percent. These signal currents are summed at summing junction 26 and are coupled to the video input terminal of analog monochrome monitor 30, which in turn applies the summed current to resistor 32, developing the combined monochrome video signal across resistor 32. This combined monochrome video signal produces an optimum shade of gray on the monitor for each of the red, green, and blue video signals and combinations thereof. With the values of resistors 20, 22, and 24 proportioned as described, a converted color background containing a green component will appear as one shade of gray, and data containing the same intensity green component but of a different converted color superimposed on the background will appear as a discrete shade of gray having optimum contrast with the background shade of gray. It is to be kept in mind that this is achieved by the non-subtractive process enforced by one or more diodes 28.

The horizontal and vertical sync signals (not shown) are applied to the monitor using any of the applicable circuits as described in the '544 application, which is incorporated herein by reference. While the specific values of resistors 20, 22, and 24 are described with respect to specific color signals R, G, and B, it is to be appreciated that the specified resistor values may be used with any of the color signals to achieve a desirable contrast between the developed shades of gray on a monochrome monitor.

Alternatively, other types of attenuators may be employed. For example, unidirectional voltage divider networks may be used to obtain the color signal voltages as described above to produce a different shade of gray for each color. In this instance, values of resistors making up the discrete voltage divider networks (not shown) would be selected to provide the voltages discussed above for each color. The networks would have one resistor of the networks coupled to ground and the other coupled to the signal line. The reduced voltage to produce a different shade of gray would be taken from a point between the resistors. Additionally, an operational amplifier may be used for each color signal, with the outputs thereof being adjusted to provide a different voltage level for each color signal. Still further, transformers having windings disposed to receive the discrete color signals and provide the reduced signals which are then added and provided to a monitor may be used. Further yet, capacitors and/or inductors may be substituted for the resistors, both of which serve to reduce signal voltage of the discrete color signals to the described values prior to being added. Lastly, diffused optical coupling may be used wherein optical elements for reducing transmitted light by the described proportions would be included between a light source and a light receiver in order to reduce discrete color signals to the described levels prior to being summed.

Operation of the circuitry of FIG. 1 assumes video signals R, G, and B are elicited from computer 12 by virtue of the load resistors 14 each presenting a desired 75 ohms to the R, G, and B terminals of the "D" connector coupled to video card 10. These video signals are applied to the bases 16 of respective PNP transistors 18, each being coupled as an emitter-follower, and as such, they modulate current flow from the (+) bias source through a load resistor 17, diode 28, and one of resistors 20, 22, or 24 to and across current summing resistor 32 as a monochrome signal voltage. This voltage is thus proportional to the sum of the contributing currents arising from the three input circuits. A voltage is a contributing voltage if input video signal voltage is greater than the potential at junction 26. Thus, the voltage across summing resistor 32, which is a monochrome signal voltage, will be derived from those video signals that are higher than the voltage at junction 26. Further, if a would-be contributing voltage is less than the voltage already across summing resistor 32, there cannot be a subtractive effect because diode 28 blocks any reverse current flow. This, of course, is in contrast to the Bryan system where all color signals are in effect whether they be positive or negative.

The discrete current flows are permitted to flow to summing resistor 32 to develop as a composite a voltage which is representative of a desired input to analog monochrome monitor 30. As stated, this monitor is relatively inexpensive and, as constructed, is only intended to receive the described intensity levels of OFF, DIM, NORMAL, and BRIGHT. However, as applicant has discovered, these inexpensive monitors are capable of displaying the much greater gray scale developed by mixing of the color signals as described herein.

Figure 2:
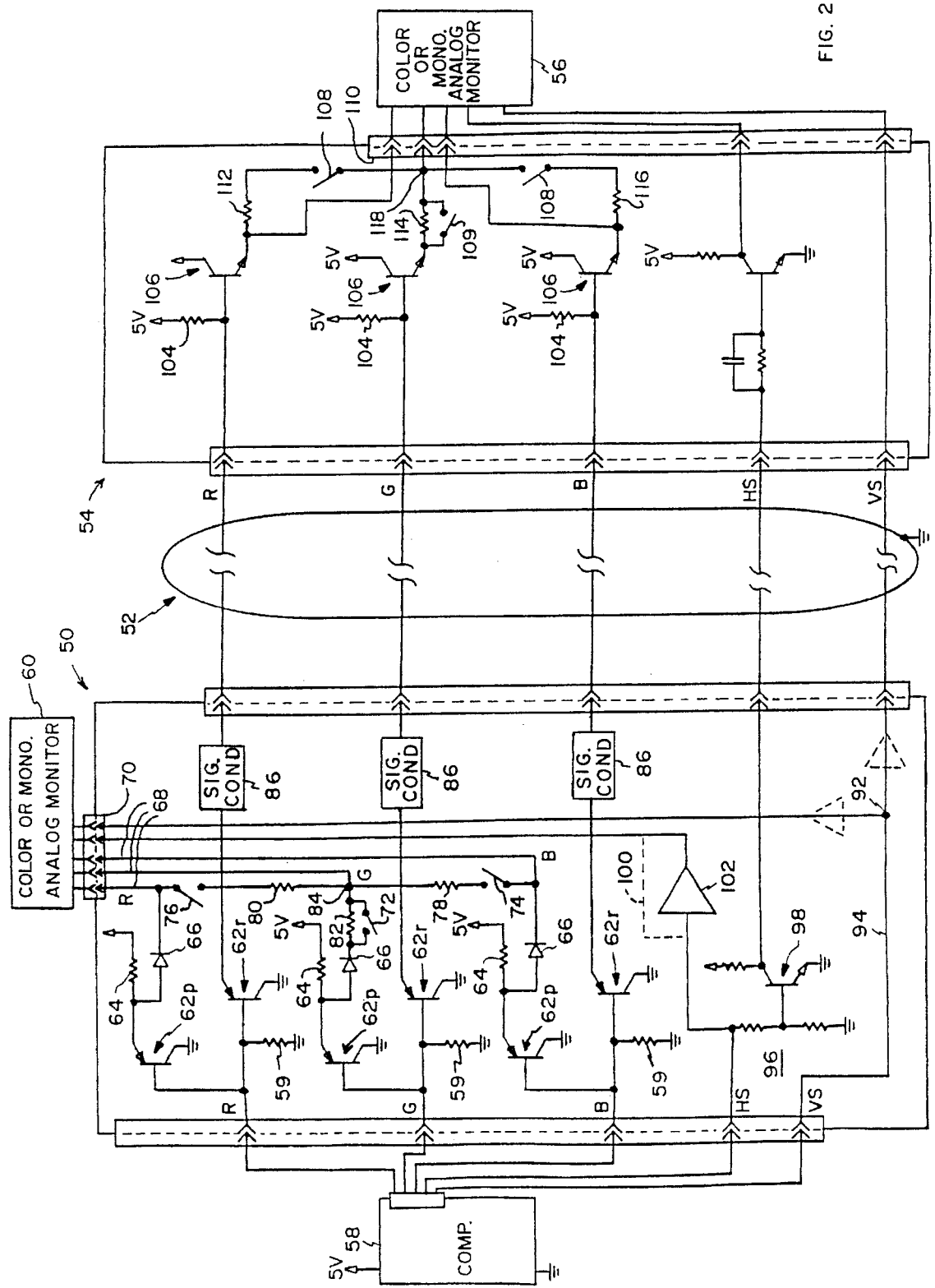
FIG. 2 is a schematic diagram illustrating an embodiment of this invention which provides color analog or a monochrome signal to a color analog or monochrome monitor located either proximate to a computer or distantly located from it.

FIG. 2 illustrates a modified communications link as described in the '544 application, and incorporated herein by reference. FIG. 2 illustrates a communications link for coupling a computer providing color video signals to two monitors, which may be color or monochrome. One of the monitors is located proximate the computer, and the other monitor is remotely located a significant distance from the computer, with the various signals being transmitted to the remote monitor over an extended link as described in referenced application. Also as described, power and reference grounds are provided to the circuitry of FIG. 2 from the keyboard port of the computer.

The communications link of referenced application is modified to be conveniently configurable so that a monochrome or color VGA monitor may be coupled to both the proximate and remote positions of the link. This is in contrast to referenced application, wherein one monitor is specified to be monochrome, and the other is specified to be color.

In this embodiment, the VGA color analog signals from a computer 10 as shown in FIG. 1 are each first applied across a load resistor 59 of about 75 ohms to emulate the load of a color monitor, after which the signal is split in signal conditioning circuitry 50, with one set of the color signals being fed via an extended cable 52 to signal conditioning circuitry 54. Circuitry 54 in turn is coupled to an analog monitor 56, which may be color or monochrome and remotely located from the computer. The other set of color signals from circuit 50 is fed to the analog monitor 60, which also may be color or monochrome and located proximate to the computer.

Splitting of the analog color video signals to obtain two discrete sets of R, G, and B signals is accomplished by applying the discrete R, G, and B signals from the computer to the bases of respective sets of PNP transistors 62p and 62r, the bases of each of these sets of transistors being coupled in parallel with a respective one of the R, G, and B signals. Transistors 62p each provide one of the R, G, and B signals to the proximate monitor, and transistors 62r each provide one of the R, G, and B signals to the remote monitor. Transistors 62p and 62r are each connected in emitter-follower configuration, with the collectors of transistors 62p and 62r being coupled to ground and the emitters of transistors 62p being connected to the source of power from the keyboard port of the computer. This source of power is typically +5 volts and is provided to the emitter of each of transistors 62p through a load resistor 64.

Coupled as described, transistors 62p each serves as a current modulator as described for transistors 18 of FIG. 1 and develops a corresponding one of the R, G, and B video signals as a voltage signal on the emitters thereof, which signals are offset by the 700-millivolt rise across transistors 62p. To eliminate this voltage offset, these video signals are each passed through diodes 66 to provide a 700-millivolt voltage drop of the analog video signals and to block reverse current flow.

From the cathodes of diodes 66, the R and B signals are coupled, in a signal path used for color video signals, directly to the R and B terminals 68 of a connector 70 adapted to receive a mating plug from a VGA color monitor. The G video signal is passed from the cathode of diode 66 through a normally closed switch 72, which may be a two-position DIP type switch or two contacts bridged by a jumper, to the G terminal of plug 70.

For converting the color signals to monochrome signals and for providing them to a monochrome VGA monitor, the color signals are routed through a second signal path through normally open switches 74 and 76, which also may be DIP switches or terminals bridged by jumpers, and which are closed, passing the R and B signals to resistors 78 and 80. Resistors 78 and 80 are coupled as shown in series between a switched terminal of switches 74 and 76, respectively, and a common point 84 and carry reduced R and B signals to common point 84 when switches 74 and 76 are closed. A resistor 82, also part of the second signal path, in parallel with switch 72 and coupled between the cathode of diode 66 and common point 84, provides a reduced G signal to common point 84 when switch 72 is opened, combining the reduced G signal with the reduced R and B signals. Common point 84 is terminated in a common load resistance in monitor 60 as illustrated in FIG. 1 for monitor 32.

With the values of resistors 80, 82, and 78 corresponding to the values of resistors 20, 22, and 24 of FIG. 1, a mixed monochrome VGA video signal is provided to the G terminal of plug 70 when switch 72 is opened and when switches 74 and 76 are closed. This provides the mixed monochrome video signal to the G terminal of plug 70, which in turn provides the monochrome signal to the video terminal of the monochrome monitor. As the plug of a monochrome monitor is not provided with terminals corresponding to the R and B terminals of plug 70, the R and B signals, while still applied to the R and G terminals of plug 70, are not coupled to the monitor. As is true for the circuit of FIG. 1, the resistor values of 20 ohms, 7.5 ohms, and 27 ohms may be used in any combination with respect to the R, G, and B derived signals.

For the remote monitor, each transistor 62r has its emitter connected through a conductor of cable 52 to provide a base input for a respective transistor 106 of signal conditioning circuit 54. Also, the emitter of each transistor 62r has its operating bias provided through a load resistor 104 located in signal conditioning circuit 54. However, a source of this bias is provided by a separate conductor of cable 52 (not shown) which is powered from the computer. Each of the color signals developed by transistors 62r of conditioning circuit 50 is passed through an impedance network 86 which includes the feature of signal predistortion to counteract cable induced distortion. This network can vary in complexity from a single resistor to a more complex R-C capacitance circuit, and it is particularly dealt with in the '544 reference.

Alternately, the color conversion circuitry may be incorporated in a signal conditioning circuit 54 of a VGA long distance communications link as described in the '54 application simply by eliminating transistors 62p and their associated circuitry so that the R, G, and B signals from computer 58 are only coupled to transistors 62r.

Thus, at the opposite end of cable 52, the conversion circuitry may be configured by appropriately setting switches 108 and 109 so that either color or monochrome signals may be applied to a color or monochrome monitor 56. Likewise, for providing VGA signals only to a monitor proximate to the computer, transistors 62r and the circuitry associated with the long distance link may be omitted. In this case, and as described, switches 72, 74, and 76 would be appropriately configured to provide either monochrome or color signals to a monochrome or color monitor 60. Further, the color conversion circuitry may be incorporated in a variety of computer links that couple one or more computers to devices that may regenerate, split, or otherwise condition the video signals in some manner prior to making the video signals available as an output.

Referring to signal conditioning circuit 54, each of the R, G, and B color signals are discretely supplied to monitor 56 by a transistor 106, the base of each being driven by a respective transistor 64r as described. Each transistor 106 is connected as an emitter-follower, with its collector being connected to a 5-volt bias source supplied from the computer as described above. As shown in FIG. 1, the output of each transistor 106 is supplied as a discrete color output to two discrete signal paths, one of which is selected depending on whether a color or monochrome monitor is coupled to circuit 54 via connector 110. In one instance, that of providing color signals, the G signal is supplied through closed, single pole, single throw switch 109, with switches 108 being open, forcing the R and B signals to bypass resistors 112 and 116. This arrangement supplies color signals to monitor 56 for providing a color presentation.

In order to provide a monochrome drive system, the R, G, and B signals are brought to a summing junction 118 via resistors 112, 114, and 116, respectively, which correspond to resistors 20, 22, and 24, as described in the forgoing. Here, the reduced R and B signals are connected through respective closed switches 108, and the G signal is coupled through resistor 114 when switch 109 is opened. Summing junction 118 is connected through a load resistor to a ground of monitor 56 (not shown) as illustrated for load resistor 32 of monitor 30 in FIG. 1. Thus, there appears at junction 118 a voltage which results from the weighted, added contributions of voltages from the emitters of transistors 106.

It is to be borne in mind that the original color signals impressed across input resistors 59 of signal conditioning circuit 50 vary in voltage from 0 to 0.7 volt. Considering the diode voltage drop across each transistor 62r, the voltage which appears at the base input of each transistor 106 varies from approximately 0.7 volt to 1.4 volts. After this, however, 0.7 volt is removed by the emitter junction drop of each of transistors 106, with the result that at the emitter terminal of each of transistors 106, there is a possible voltage swing of from approximately 0 to 0.7 volt. Thus, with a maximum level of 0.7 volt being available for providing current through each of resistors 112, 114, and 116, the maximum voltage which can appear at junction 118 is somewhat less than 0.7 volt, depending upon the ratio of these resistors and the load resistor in monitor 56, which load resistor corresponds to resistor 32 of FIG. 1.

Considering that the emitter circuit of each of transistors 106 may be considered a diode, and that there can be no reverse flow from junction 118 to the base of transistors 106, it is to be appreciated that there can be no subtractive effect by any one of the color signals. This, for example, ensures that there first occur a color signal current which produces a discrete voltage at junction 118 and across the load resistor in monitor 56 of, for example, 0.4 volt. Second, unless a second color produces a higher voltage than the 0.4 volt, it will produce no effect. If the second signal is higher, say, 0.5 volt, a new current flow is produced, tending to create an increased voltage to arise between the voltages until equilibrium is reached between the first and second signals. If the equilibrium voltage from the two signals is lower than the lowest color signal, both color signals will contribute to the equilibrium voltage at junction 118. Otherwise, the signal voltage which is lower than the equilibrium voltage will not contribute or subtract to/from the equilibrium voltage at junction 118. Thus, the monochrome system has this unique limitation, one not provided by Bryan.

As with resistors 78, 80, and 82 in signal conditioning circuit 50, the values of the resistors 112, 114, and 116 are selected to be 20 ohms, 7.5 ohms, and 27 ohms, respectively, for the red, green, and blue video signal paths so as to reduce the potentials of the R, G, and B video signals to 78 percent, 91 percent, and 73 percent, respectively, of their original maximum values of 700 millivolts.

While certain electrical components in this last embodiment have been stated as having specific values, it is noted that these values may be changed by as much as 20 percent without significantly affecting operation of the described circuitry.

It is also to be noted that in this specific embodiment, as with the others described herein, the signal conditioning networks shown in separate enclosures, or portions thereof, may be incorporated into the computer and monitor or keyboard, or any other device, with the extending cable coupled between the computer and monitor and keyboard. Additionally, while a computer and at least one monitor are shown and described as being coupled by the instant invention, it is to be noted that other devices, such as signal generators, that provide VGA signals, or other devices, such as computer signal switching circuitry that simply relay or switch VGA signals, may be substituted for either the computer or monitor.

After having described my invention and the manner of its use, it is apparent that incidental changes may be made thereto that fairly fall within the scope of the following appended claims, wherein

I claim:

1. A computer-monitor interface for converting analog VGA color signals to gray scale monochrome signals for feeding to the input of a monochrome monitor, comprising:

a source of color analog VGA signals, consisting of discrete R, G, and B signals, one of each said VGA signals being applied to a separate conductor, wherein said R, G, and B signal conductors together provide all color signal information;

analog buffering means in circuit with one of each said conductors for receiving discrete color analog VGA signals;

a common junction coupled to a load impedance; and first, second, and third unidirectional proportioning means, each being in circuit with a respective one of said buffering means, for unidirectionally providing an output current flow to said common junction, and each comprising signal unidirectional means and impedance means through which current flows to said common junction, whereby current flow to said common junction is only additive.

2. An interface as set forth in claim 1 wherein each said analog buffering means comprises a transistor configured to provide current amplification.

3. An interface system as set forth in claim 2 wherein each said transistor is a PNP transistor coupled in emitter-follower configuration, each having a collector coupled to a reference potential and an emitter coupled in circuit with said unidirectional proportioning means.

4. An interface as set forth in claim 3 wherein each said unidirectional proportioning means further comprises a diode through which said current flows to said common junction.

5. An interface as set forth in claim 1 wherein said first unidirectional proportioning means is effective with respect to an R signal, said second unidirectional proportioning means is effective with respect to a G signal, and said third unidirectional proportioning means is effective with respect to a B signal, and each said impedance means is valued wherein one of said signals is relatively reduced by a said impedance by approximately 22 percent, a second of said signals is relatively reduced by a said impedance by approximately 9 percent, and a third of said signals is relatively reduced by a said impedance by approximately 27 percent.

6. An interface as set forth in claim 5 wherein each said impedance means is a resistor, one of said resistors having a value of approximately 20 ohms, another of approximately 7.5 ohms, and the last of approximately 27 ohms.

7. An interface as set forth in claim 1 wherein each of said unidirectional proportioning means are electrically exclusive.

8. A conversion system for converting analog VGA color signals to gray scale monochrome signals comprising:

a source of color analog VGA video signals, including R, G, and B signals, each having varying amplitude and a maximum amplitude of about 700 millivolts, one of each said R, G, and B signals being applied to a respective R signal conductor, a G signal conductor, and a B signal conductor;

a load impedance coupled between each of said signal conductors and a reference potential, for emulating an electrical load of a VGA color monitor;

first, second, and third signal buffers, each having an input coupled to a respective one of said signal conductors, and an output terminal responsive to a respective one of said R, G, and B signals for providing on each said output terminal a respective signal voltage;

first, second, and third current limiting means, one of each being coupled to one of each said output terminal of respective ones of said first, second, and third signal buffers for limiting each said current flow from each said voltage potential; and a common junction responsive to said first, second, and third current limiters for additionally combining each limited said current flow to develop an analog monochrome VGA video signal potential having an optimum level of contrast between each of the R, G, and B signals and all mixtures thereof.

9. A conversion system as set forth in claim 8 wherein said first, second, and third signal buffers include transistors.

10. A conversion system as set forth in claim 9 wherein said transistors are PNP transistors coupled in emitter-follower configuration, each having a collector coupled to said reference potential and an emitter coupled to a current source and to one of said current limiting means.

11. A conversion system as set forth in claim 10 further comprising a plurality of diodes, one of each being coupled to one of each said emitter and being oriented for providing a voltage drop to offset a voltage increase at each said emitter.

12. A conversion system as set forth in claim 8 wherein said first, second, and third current limiting means each reduces signal current flow from each of said R, G, and B signals by proportions of about 22 percent, 9 percent, and 27 percent.

13. A conversion system as set forth in claim 12 wherein said first, second, and third current limiting means are resistors, one of said resistors being about 20 ohms, another of said resistors being about 7.5 ohms, and the last of said resistors being about 27 ohms.

14. A conversion system for coupling analog color VGA signals to either an analog monochrome VGA monitor or analog color VGA monitor comprising:

a source of analog color VGA video signals providing at least R, G, and B video signals on respective R, G, and B signal conductors;

a current source;

first, second, and third current modulators, each having an input coupled to a respective one of said R, G, and B signal conductors, a terminal coupled to said current source, and an output terminal, for providing modulated R, G, and B signals on one of each respective said output terminals;

a plurality of first signal paths, one of each being coupled to one of each said output terminals, and each further comprising:

a unidirectional current alternator for limiting a signal current flow of each of said current modulated R, G, and B signals to limited, discretely differing R, G, and B signal current flows, and a common junction coupled to each said current attenuator, for additively combining said reduced R, G, and B currents, developing an analog monochrome VGA video signal potential having a different shade of gray for each said R, G, and B video signals and all mixtures thereof, and providing on a discrete signal conductor said monochrome video signal as a first output; and a plurality of second signal paths, one of each being coupled to one of each said output terminals of said first, second, and third current modulators, each of said second signal paths being operative in mutually exclusive relation with each of said plurality of first signal paths, for providing as a second output said current modulated R, G, and B signals.

15. A communications link as set forth in claim 14 wherein each said current attenuator limits one of said R, G, and B signal current flows by about 22 percent, limits another of said R, G, and B signal current flows by about 9 percent, and limits a last of said R, G, and B signal current flows by about 27 percent.

16. A communications link as set forth in claim 15 wherein each said current attenuator comprises a resistor coupled to one of said output terminals of a respective one of said first, second, and third current modulators.

17. A communications link as set forth in claim 16 wherein said first signal paths each further comprises:

a first switch closable between first and second switched terminals, said first terminal being coupled to said output terminal of said first current modulator, and said second terminal being coupled to said resistor for reducing said R voltage potential;

a second switch closable between third and fourth switched terminals, said third terminal being coupled to said output terminal of said second current modulator, and said fourth terminal being coupled to said resistor for reducing said B voltage potential; and a third switch closable between fifth and sixth switched terminals, said fifth and sixth terminals being coupled across said resistor for reducing said G voltage potential;

whereby with said first and second switches being closed and said third switch being open, said R, G, and B potentials are applied to respective said resistors.

18. A communications link as set forth in claim 17 wherein said plurality of said second signal paths each further comprises:

a first signal conductor coupled to said first switched terminal for providing said R video signal as a portion of said second output;

a second signal conductor coupled to said third terminal for providing said B signal as a portion of said second output; and said discrete conductor providing said G signal as a portion of said second output;

whereby with said first and second switches being open and said third switch being closed, said current modulated R, G, and B signals are provided as outputs.

19. A communications link as set forth in claim 14 further comprising a load resistance coupled between each said signal conductor and a reference potential, for emulating a load of a color monitor.

20. A communications link as set forth in claim 14 wherein said modulators are transistors, each having an emitter coupled as a said output terminal of each said first, second, and third current modulators.

21. A communications link as set forth in claim 20 comprising a diode coupled to each said emitter and being oriented for reducing said R, G, and B potentials by a diode drop to offset a voltage gain effected by the transistors and to prevent reverse current flow to each said emitter.

22. An extended VGA communications link for coupling at least analog VGA video signals R, G, and B from R, G, and B video terminals of a computer to an analog VGA monitor comprising:

a shielded insulated cable and having at least three discrete insulated conductors, each said conductor having a first end and a second end;

a bias source coupled to each said second end of said three conductors, for providing a DC bias to each said second end of said three conductors;

a plurality of modulators, each having a current input, and each being responsive to a respective one of the R, G, and B signals, one of each said current input being coupled to a said first end of a respective one of said three conductors, for powering each said modulator by said bias source through a respective said conductor and providing a modulated R, G, and B signal current flow through each of said conductors;

a plurality of amplifiers, each having an input coupled to a respective said second end of said conductors and being responsive to a respective said signal current flow, and each having an output terminal, for providing R, G, and B signal outputs on said output terminals;

a plurality of first signal paths, one of each being coupled to one of each of said output terminals, each said first path including:

unidirectional current limiter means for reducing a signal current flow of each said R, G, and B outputs to discretely differing current flows, and an additively combining junction couplable to a monochrome VGA monitor, for additively combining said discretely differing current flows to develop an analog monochrome VGA signal having an optimum contrast between various shades of gray; and a plurality of second signal paths couplable to a color VGA monitor, one of each being coupled to one of each said output terminal of respective ones of said plurality of current amplifiers, and being operative in mutually exclusive relation with said plurality of first signal paths;

whereby said gray scale VGA signal is provided to an analog VGA monochrome monitor remotely located from said computer, or said current amplified R, G, and B signals are provided to an analog VGA color monitor remotely located from said computer.

23. An extended VGA communications link as set forth in claim 22 wherein each said modulator comprises a transistor.

24. An extended VGA communications link as set forth in claim 22 comprising a plurality of load resistors, one of each being coupled to one of each said video terminals of said computer, for emulating a video load applied to each of said video terminals.

25. An extended VGA communications link as set forth in claim 22 wherein each said amplifier comprises a transistor coupled in emitter follower configuration.

26. An extended VGA communications link as set forth in claim 22 wherein a first of each said unidirectional current limiter means limits a first of said R, G, and B signal current flows by about 9 percent, limits a second of the R, G, and B signal current flows by about 22 percent, and limits a third of said R, G, and B signal current flows by about 27 percent.

27. An extended VGA communications link as set forth in claim 22 wherein said second signal path comprises a plurality of conductors, one of each being coupled between said output terminal of respective ones of said current amplifiers and a respective R, G, and B terminal couplable to said analog color VGA monitor.

28. A communications link for coupling video output terminals of an analog VGA video source from a computer and conveying at least analog VGA R, G, and B signals to a first analog VGA monitor located generally proximate said video source and to a second VGA analog monitor remotely located from said video source comprising:

a bias source from said computer;

a plurality of first current modulators, each being coupled to a bias source, and each having first output terminals and being responsive to said R, G, and B signals, for providing a first set of current modulated said R, G, and B signals, and a plurality of second current modulators each being coupled to said bias source, and each having second output terminals and being responsive to said R, G, and B signals, for providing a second set of current modulated said R, G, and B signals;

a plurality of first signal paths couplable to said first monitor where said first monitor is a VGA monochrome monitor, one of each being coupled to one of each said first output terminals, and each further comprising:

a unidirectional current attenuator for reducing a signal current flow of each of said current modulated R, G, and B signals to a discretely different, reduced current flow, and a common junction coupled to each of said current attenuators, for combining each said reduced current flow, and developing an analog monochrome VGA video signal having an optimum shade of gray for each said R, G, and B signal and all mixtures thereof;

a plurality of second signal paths couplable to said first monitor where said first monitor is a VGA color monitor, one of each being coupled to one of each said second output terminals and being operative in mutually exclusive relation with said first signal paths, for providing said current modulated R, G, and B signals to said VGA color monitor;

a shielded, insulated cable having at least three discrete, insulated conductors, each said conductor having a first end and a second end;

said bias source being coupled to each said second end of said three conductors, for providing a DC bias to each of said three conductors, and each said first end being coupled to a respective one of said second output terminals, and powering said second current modulators through a respective said conductor, for providing current modulated said R, G, and B signals through each of said conductors;

a plurality of current amplifiers each having an input coupled to one of each of said second ends of said conductors and responsive to one of each said second set of said modulated R, G, and B signals and each having a third output terminal, for providing amplified R, G, and B signal outputs on said third output terminals;

a plurality of third signal paths, one of each being coupled to one of each of said third output terminals, and each further comprising:

a second unidirectional current attenuator for reducing a signal current flow of each of said amplified R, G, and B signals to a discretely different, reduced current flow, and, a second common junction coupled to each said second current attenuators, for combining each said reduced signal current flow, developing a second analog monochrome VGA video signal having a different shade of gray for each said R, G, and B signal and mixtures thereof, and being couplable to said second monitor where said second monitor is a VGA monochrome monitor; and a plurality of fourth signal paths, each being coupled to a respective one of said third output terminals, and being operative in mutually exclusive relation with said third signal paths, for providing said amplified R, G, and B signals to said second monitor where said second monitor is a VGA color monitor.

\* \* \* \* \*